United States Patent
Takeshima

(10) Patent No.: US 6,803,074 B2
(45) Date of Patent: Oct. 12, 2004

(54) METHOD OF PRODUCING COMPLEX OXIDE THIN-FILM AND PRODUCTION APPARATUS

(75) Inventor: Yutaka Takeshima, Nagaokakyo (JP)

(73) Assignee: Murata Manufacturing Co. Ltd (JP)

( * ) Notice: Subject to any disclaimer, the term of this patent is extended or adjusted under 35 U.S.C. 154(b) by 24 days.

(21) Appl. No.: 09/916,804

(22) Filed: Jul. 27, 2001

(65) Prior Publication Data

US 2002/0076485 A1 Jun. 20, 2002

(30) Foreign Application Priority Data

Jul. 27, 2000 (JP) ........................................ 2000-226938

(51) Int. Cl.$^7$ ........................... C23C 16/00; B05D 3/02; B05D 3/04; B05D 1/02
(52) U.S. Cl. ..................... 427/248.1; 427/226; 427/327; 427/294; 427/350; 427/377; 427/379; 427/376.2; 427/419.3; 427/421; 427/126.3
(58) Field of Search ......................... 427/81, 226, 327, 427/294, 350, 377, 379, 376.2, 419.3, 421, 126.3, 248.1

(56) References Cited

U.S. PATENT DOCUMENTS

| | | | | |
|---|---|---|---|---|
| 5,009,928 A | * | 4/1991 | Hayashi et al. ........... | 427/126.3 |
| 5,456,945 A | * | 10/1995 | McMillan et al. .......... | 118/715 |
| 5,741,554 A | * | 4/1998 | Tisone ....................... | 427/424 |
| 5,767,302 A | * | 6/1998 | Ogi et al. .................... | 501/1 |
| 5,889,459 A | * | 3/1999 | Hattori et al. ............... | 338/9 |
| 5,916,640 A | * | 6/1999 | Liu et al. ..................... | 427/475 |
| 6,048,766 A | * | 4/2000 | Gardner et al. ............. | 438/257 |
| 6,116,184 A | * | 9/2000 | Solayappan et al. ........ | 118/326 |
| 6,143,063 A | * | 11/2000 | Hayashi et al. ............ | 106/287.18 |

FOREIGN PATENT DOCUMENTS

| JP | 5-76838 A | | 3/1993 |
|---|---|---|---|
| JP | 9-219497 | | 8/1997 |
| JP | 2000-36244 A | * | 2/2000 |

OTHER PUBLICATIONS

Korean Office Action issued Jul. 30, 2003 (w/English translation).

* cited by examiner

Primary Examiner—Michael Barr
(74) Attorney, Agent, or Firm—Dickstein, Shapiro, Morin & Oshinsky, LLP.

(57) ABSTRACT

A metal compound solution in the atomized state is introduced directly into a film-forming chamber of which the pressure is maintained at about 100 Torr or lower by mean of a two-fluid nozzle to form a complex oxide thin-film. For use in the two-fluid nozzle, gases including an oxidative gas are used. To dissolve the metal compound, a solvent having a boiling point under ordinary pressure of about 100° C. or higher is used.

17 Claims, 2 Drawing Sheets

METHOD OF PRODUCING COMPLEX OXIDE THIN-FILM AND PRODUCTION APPARATUS

BACKGROUND OF THE INVENTION

1. Field of the Invention

The present invention relates to a method of producing a complex oxide thin-film and an apparatus for producing the complex oxide thin-film, and more particularly, to a method of producing a complex oxide thin-film for use in electronic devices such as a thin-film capacitor capable of presenting a large capacitance even if the capacitor has a small area, and so forth, and an apparatus for producing the complex oxide thin film.

2. Description of the Related Art

Recently, development of high density circuits for electronic parts have been made. Regarding electronic devices such as monolithic ceramic capacitors and so forth, it has been increasingly required that the sizes are further reduced and the performances are more enhanced.

Ordinarily, monolithic ceramic capacitors are produced by the following method.

(1) First, electrode paste is printed on a ceramic green sheet cut to a predetermined size and dried.

(2) Then, the green sheets each having the electrode paste printed and dried are laminated, and bonded under pressure to produce a laminated, press-bonded block.

(3) The laminated, press-bonded block is cut in predetermined positions and separated into individual elements.

(4) The elements individually separated are fired under predetermined conditions.

(5) An external electrode paste is applied to a predetermined location of the fired element, and is baked to form the external electrode. Thereby, a monolithic ceramic capacitor is obtained as the product.

When the monolithic ceramic capacitor is produced by the above-described conventional method, the thickness of the dielectric layer thereof can not be reduced to be smaller than the grain size of ceramic raw material powder. Even if the thickness is larger than the grain size of the ceramic raw material powder, there will arise the problem that for a dielectric layer having an excessively small thickness, short-circuits and electrode-intersections are readily caused due to deficiencies in the dielectric layer. Thus, at present, it is difficult to produce monolithic ceramic capacitors having a dielectric layer with a thickness below about 1 $\mu$m. Development of such capacitors having a reduced size and increased capacitance is thus limited.

To solve such problems and produce monolithic ceramic capacitors having a dielectric layer with a thickness of up to 1 $\mu$m, thin-film manufacturing processes such as a CVD method, a sol-gel method, a PVD method, and so forth have been investigated as methods of producing dielectrics.

Of these methods, the CVD method in which a raw material gas is introduced into a film-forming chamber and is formed into a film on a heated substrate is characterized in that a film with a good crystallinity and a high dielectric constant can be obtained. However, if many constitutional elements are employed, the apparatus becomes very complicated, increasing the cost.

If dielectric materials such as $BaTiO_3$, $SrTiO_3$, $(Ba, Sr)TiO_3$, $PbTiO_3$, $Pb(Zr, Ti)O_3$, $(Pb, La)TiO_3$, $(Pb, La)(Zr, Ti)O_3$, $Pb(Mg, Nb)O_3$ or the like, which present a high dielectric constant, are used, it is necessary to heat the materials under reduced pressure for vaporization or sublimation since the raw materials are solid or liquid at ordinary temperature and pressure.

Moreover, the materials need to have a sufficient vapor pressure for vaporization or sublimation of the materials. Furthermore, it is required for production of a complex oxide film that the temperature at which a material having the highest gasification temperature is lower than the decomposition temperature of a material having the lowest decomposition temperature. Therefore, the selection range for the materials becomes very narrow. Thus, in general, there arises the problem that the use of expensive materials becomes necessary.

Generally, it is needed to heat a raw material for gasification. Accordingly, there arise the problems that chemical reactions such as polymerization or the like of the material itself occurs to modify the material, the gasification quantity can not be stably obtained, and it is difficult to control the composition.

To solve such problems, there has been proposed a method in which a CVD raw material, dissolved in THF (tetrahydrofuran: $C_4H_8O$), is fed to a heated carburetor, in which the solution is atomized and gasified. The material, in the gasified state, is carried to a film-forming chamber to be film-formed (Japanese Unexamined Patent Application Publication No. 9-219497).

In this method, it is not required to heat the material in the process prior to the gasification. Thus, modification of the material can be inhibited. On the other hand, the gasified material needs to be carried to the film-forming chamber. Accordingly, it is necessary to select the raw material as to cause no condensation, solidification, decomposition and so forth, in the transportation process. This method is thus similar to the ordinary CVD method in the respect of the fact that the selection range for the raw material is limited.

Moreover, Japanese Unexamined Patent Application Publication No. 9-213643 discloses a method in which a raw material solution is atomized by means of a supersonic atomizer, and the formed droplets are carried to a chamber maintained under a pressure of 200 to 700 Torr and are vapor-deposited on a substrate held in the chamber, and thereafter, the vapor deposition film is heat-treated at a temperature of 550 to 850° C., whereby a dielectric thin-film is obtained. In this method, the film-forming process by the MOD or sol-gel method is carried out by use of atomized droplets. Characteristically, raw materials excluding the above-described CVD raw materials can be used, and moreover, vapor deposition can be performed nearly at ordinary temperature.

However, the film-forming in this method is carried out at nearly room temperature and under a relatively high pressure. Therefore, organic components contained as droplets in the film remain there. Thus, reduction in pressure and drying after the film-forming, and a heat treatment thereafter are indispensable. Thus, there arises the problem that cracking or the like is readily caused in the processes of drying and heat treatment. This problem is similar to that of the sol-gel method. Accordingly, even if formation of a dielectric film having no cracks is attempted by this method, reduction in pressure, drying and heat treatment after the film-formation can not be sufficiently carried out. There arise the problems that organic components remain in the film, sufficient crystallization can not be performed and a high dielectric constant can only be attained with difficulty.

SUMMARY OF THE INVENTION

To solve the above problems, the present invention has been devised. It is an object of the present invention to provide a method of producing a complex oxide thin-film in which a complex oxide thin-film having a high dielectric constant and a good reliability can be efficiently produced by use of an inexpensive raw material, without need of a complicated process, and to provide an apparatus for producing the complex oxide thin film.

To achieve the above object, according to the present invention, there is provided a method of producing a complex oxide thin-film which comprising the steps of (a) dissolving at least two kinds of metal compounds in a solvent to prepare a metal compound solution, (b) putting the metal compound solution into an atomized state by means of a two-fluid nozzle, and directly introducing the atomized solution into a film-forming chamber of which the pressure is kept at about 100 Torr or lower, and (c) forming a complex oxide thin-film on a substrate placed in the film-forming chamber and heating to a temperature equal to or higher than the boiling point of the solvent.

Since the metal compound solution is put into an atomized state by means of the two-fluid nozzle, and the atomized solution is introduced into the film-forming chamber of which the pressure is kept at about 100 Torr or lower, it is not necessary that the metal compound solution be gasified or atomized and carried in a piping. Thus, the relation between the gasification temperature and the decomposition temperature is not an issue. The selection flexibility for the raw materials is enhanced. Thus, the complex oxide thin-film having a high dielectric constant and a good reliability can be efficiently produced.

As an atomizing device, a two-fluid nozzle is employed. Thus, a sufficient kinetic velocity can be rendered to the formed droplets, and the film can be efficiently formed on the heated substrate.

The two-fluid nozzle means a nozzle which can mix a liquid and a gas and inject the mixture so as to atomize the liquid. The concrete configuration and structure of the nozzle have no special limitations.

Preferably, the gas used in the two-fluid nozzle contains an oxidative gas. Since the gas used in the two-fluid nozzle contains an oxidative gas, the film-forming can be carried out in an oxidative atmosphere in the film-forming chamber. Thus, the complex oxide thin-film of which the characteristics are stable can be efficiently produced.

Also, preferably, the solvent for dissolving the at least two kinds of the metal compounds have a boiling point of at least about 100° C. under ordinary pressure. When a solvent having a boiling point of at least about 100° C. under ordinary pressure is used, the solvent component contained in the raw material in the atomized state is evaporated before the raw material reaches near the substrate. Thus, the raw material can be efficiently formed into a film while powdering of the raw material is inhibited or prevented.

Although a solvent with a high boiling point (boiling point under ordinary pressure of about 100° C. or higher) is used as the solvent, the organic component can be suppressed from remaining in the film under the film-forming conditions, and a complex oxide thin-film having a good crystallinity and a high dielectric constant can be produced, since the pressure in the film-forming chamber is set at about 100 Torr or lower and the film-forming is carried out with the substrate being in the heated state.

More preferably, at least one metal compound of at least two kinds of the metal compounds is a dipivaloylmethanato complex. This makes it possible to use the raw material effectively and stabilize the raw material composition while the raw material is efficiently prevented from being decomposed during transport process. Thus, the characteristic of the thin-film can be stabilized.

Also, preferably, at least one metal compound of at least two kinds of the metal compounds is an acetylacetonato complex. As a result, the decomposition of the raw material during transport process can be efficiently prevented. It becomes possible to use the raw material effectively and stabilize the raw material composition. Thus, the characteristics of the thin-film can be stabilized.

Also, preferably, at least one metal compound of at least two kinds of the metal compounds is a metal alkoxide. This allows the decomposition of the raw material during transport to be efficiently prevented. It becomes possible to use the raw material effectively and stabilize the raw material composition. Thus, the characteristics of the thin-film can be stabilized.

More preferably, the complex oxide thin-film is formed by carrying out film-forming at least two times, and after each film-forming, the film is heat-treated under a pressure lower than that employed for the film-forming. As a consequence, the organic component can be prevented from remaining in the film, which improves the dielectric constant of the formed dielectric thin-film and enhances the reliability.

Also, preferably, at least the film obtained after the final film-forming step is heat-treated at an oxygen gas partial pressure higher than the oxygen gas partial pressure at film-forming. This results in a complex oxide thin-film having a high crystallinity and a less oxygen deficiency.

The apparatus for producing a thin-film of the present invention, which is for use in carrying out the method of producing a complex oxide thin film in accordance with the present invention, comprises a solution feeding mechanism for feeding the metal compound solution, a two-fluid nozzle for putting the metal compound solution into a atomized state, a film-forming chamber into which the metal compound solution in the atomized state is introduced and is film-formed into a complex oxide thin-film, a substrate heater for heating the substrate placed in the film-forming chamber to a temperature higher than the boiling point of the solvent, and a pressure-reducing pump for the pressure in the film-forming chamber to about 100 Torr or lower.

With the apparatus for producing a complex oxide thin-film, constituted as described above, the method of producing a complex oxide thin-film in accordance with the present invention can be securely carried out, and a complex oxide thin-film having a high dielectric constant and a good reliability can be efficiently produced.

DESCRIPTION OF THE PREFERRED EMBODIMENTS

Hereinafter, embodiments of the present invention will be described for illustration of the characteristics of the present invention.

Figure 1:
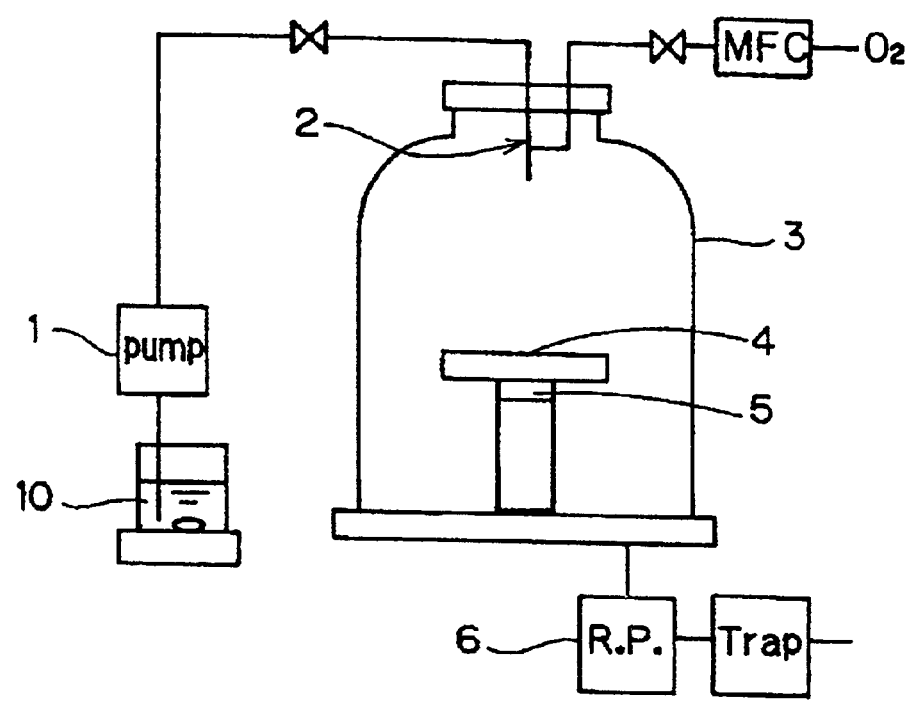
FIG. 1 is a schematic view showing the essential stricture of an apparatus for producing a complex oxide thin-film according to an embodiment of the present invention.

FIG. 1 is a schematic view showing the essential structure of an apparatus for producing a complex oxide thin-film according to an embodiment of the present invention. FIG.

2 illustrates the structure of a two-fluid nozzle used in the apparatus for producing a thin-film according to the embodiment of the present invention.

As shown in FIG. 1, the apparatus for producing a thin-film comprises a solution-feeding mechanism (in this embodiment, a diaphragm-type liquid-feeding pump) 1 for feeding a meal compound (raw material solution) 10, a two-fluid nozzle 2 for putting the metal compound solution 10 into the atomized state, a film-forming chamber 3 into which the metal compound solution 10 in the atomized state is introduced, a substrate heater 5 for heating a substrate 4 disposed in the film-forming chamber 3, and a pressure-reducing pump (in this embodiment, a rotary pump) 6 which can reduce the pressure in the film-forming chamber to about 3 to 100 Torr or lower.

Figure 2:
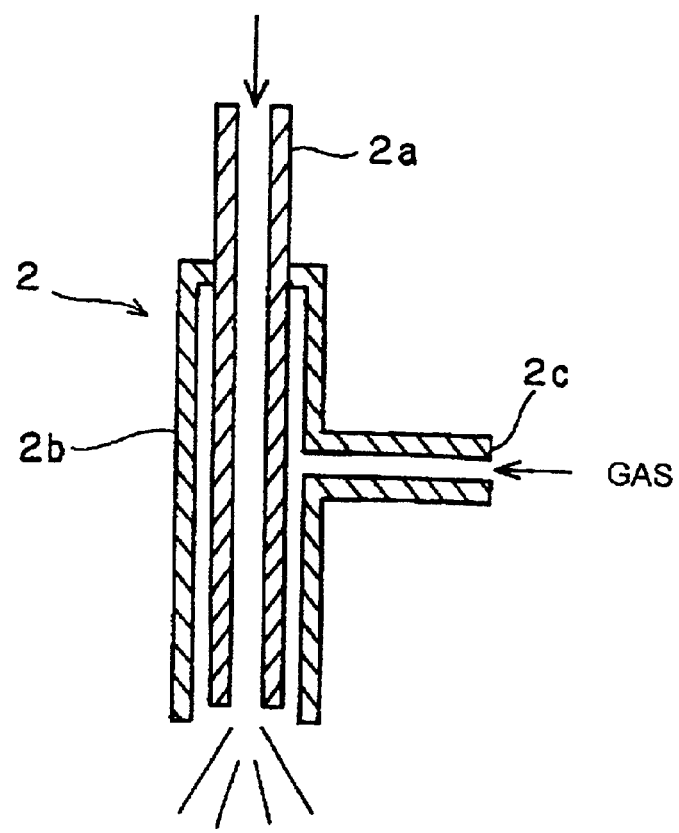
FIG. 2 illustrates the structure of a two-fluid nozzle employed in the apparatus for producing a complex oxide thin-film according to the embodiment of the present invention.

Moreover, as shown in FIG. 2, the two-fluid nozzle 2 comprises a center tube 2a through which the metal compound solution (raw material solution) 10 is passed and an outer tube 2b provided on the outer side of the center tube 2a. In the structure, gas is introduced through a gas inlet 2c provided for the outer tube 2b, and is passed through the space between the center tube 2a and the outer tube 2b. The raw material solution 10 passed through the center tube 2a is mixed with the gas to be atomized, and thereby, in the mist state, is introduced into the film-forming chamber 3.

That is, the raw material for the complex oxide is carried to the vicinity of an inlet of the film-forming chamber 3 is the state of a stable solution, and the raw material is then introduced into the film-forming chamber 3 in the mist state so that the raw material is vaporized in the film-forming chamber 3. By this way, the present invention can successfully solve the problems associated with the conventional art.

The center tube 2a is a hollow circular tube with an inner diameter of 0.25 mm. The space formed between the center tube 2a and the outer tube 2b, through which gas is passed, has a plane section having a donut-shape (ring-shape) with an inner diameter of 1.59 mm and an outer diameter of 2.3 mm.

Complex oxide thin-films were produced by the methods described in the following Examples 1 to 3 by use of the apparatus for producing a thin-film constituted described above.

EXAMPLE 1

First, as the metal compounds (Ba raw material, Sr raw material and Ti raw material), $Ba(C_{11}H_{19}O_2)_2$, $Sr(C_{11}H_{19}O_2)_2$ and $Ti(i-OC_3H_7)_2(C_{11}H_{19}O_2)_2$ were prepared. As the solvent, butoxyethanol (boiling point: 173° C.) was prepared. It is to be noted that $C_{11}H_{19}O_2$ denotes a dipivaloylmetanato ligand and may be referred to as "DPM". Also, as is known, $i-OC_3H_7$ denotes a isopropoxide ligand. Thereafter, the Ba raw material, the Sr raw material and the Ti raw material were compounded at a molar ratio of 70:30:100.

To the compounded raw materials, the solvent was added in such an amount that the total molarity was 0.03 mol/l and was stirred for 60 minutes by means of a magnetic stirrer to obtain a metal compound solution (raw material solution).

After this, complex oxide thin-films were formed on a substrate 4 by use of the raw material solution under the conditions shown in Table 1.

TABLE 1

| | |
|---|---|
| Ba raw material | $Ba(DPM)_2$ |
| Sr raw material | $Sr(DPM)_2$ |
| Ti raw material | $Ti(O-i-C_3H_7)_2(DPM)_2$ |
| solvent | butoxyethanol |
| raw material molar ratio of Ba:Sr:Ti | 70:30:100 |
| solution concentration | 0.03 mol/l |
| $O_2$ gas flow rate | 5 LM |
| film-forming temperature | 550° C. |
| film-forming chamber pressure | 12 Torr |
| film-forming time | 20 minute |

For film-forming of the complex oxide thin-films, a sapphire R-plane substrate (20×20×0.35 mm) sputtered with Pt was used as the substrate 4. Two substrates were set on the substrate heater 5 in the film-forming chamber 3. Then, a metal mask (not shown) with an opening of 18×16 mm for use in forming of a lower electrode is disposed on the substrate 4.

Thereafter, $O_2$ gas was made to flow in the two-fluid nozzle 2 at a rate of 400 CCM, the pressure in the film-forming chamber 3 was reduced by means of the rotary pump 6, and heating of the substrate 4 was started. At his time, the pressure in the film-forming chamber 3 was 1 Torr.

After substrate 4 reached the film-forming temperature, it was kept as it was for a predetermined time. The $O_2$ gas flow rate was adjusted to 5 LM, and this state was maintained for 5 minutes. Thereafter, introduction of the raw material solution from the liquid-feeding pump 1 into the two-fluid nozzle 2 was started. For introduction of the raw material solution 10, the diaphragm-type liquid-feeding pump 1 was operated at 1 pulse/2 seconds. The movement distance of the diaphragm was set so that the liquid feeding rate was 0.8 CCM. The pressure in the film-forming chamber 3 was set at 12 Torr.

The film-forming was carried out for 30 minutes, and then feeding of the raw material solution 10 to the two-fluid nozzle 2 was stopped. Five minutes after the stopping, the $O_2$ gas rate was adjusted to 400 CCM and the pressure in the film-forming chamber 3 was kept at 1 Torr for 30 minutes (the temperature was 550° C.) again. Thereafter, the pressure in the film-forming chamber 3 was recovered to the atmospheric pressure and the substrate 4 was cooled.

After the film-forming, 50 Pt upper electrodes with a diameter of 0.5 mm were formed on the complex oxide thin-film of Ba, Sr and Ti (hereinafter, also referred to as a BST complex oxide thin-film) by use of the metal mask. The electrostatic capacitance, the tan δ, and the leak current, caused when a DC voltage was applied, of the BST complex oxide thin-film under the condition of 1 kHz and 100 mV by means of an LCR meter were measured. The averages of the measurements are listed in Table 2.

TABLE 2

| electrostatic capacitance | tan δ | leak current at 1 V | breakdown voltage |
|---|---|---|---|
| 3490 pF | 1.9% | 350 pA | 9.2 V |

As shown in Table 2, it was ascertained that the produced BST complex oxide thin-film, even though it is not heat-treated in the $O_2$ gas stream, can present a high capacitance and sufficient characteristics as a thin-film capacitor with respect to tan δ (loss) and leak current.

After the characteristics were measured as described above, the cross-sections of the BST complex oxide thin-films were observed. The film-thicknesses were measured. The film-thicknesses of the BST complex oxide thin-films were 100 nm.

Furthermore, the thin-film composition ratio was analyzed by an ICP method. The thin-film composition ratio was Ba:Sr:Ti=33:15:52. That is, the composition was almost the same as that of the raw material solution.

Next, the BST complex oxide thin-film produced was heat treated in an $O_2$ gas stream at 600° C. for 3 hrs. (at 760 Torr). The electrostatic capacitance, the tan δ, and the leak current, caused when a DC voltage was applied, were measured. Table 3 shows the averages of the measurements.

TABLE 3

| electrostatic capacitance | tan δ | leak current at 1 V | breakdown voltage |
|---|---|---|---|
| 4220 pF | 2.3% | 5.0 pA | 11.7 V |

As shown in Table 3, it was ascertained that with the heat treatment in the $O_2$ gas stream, the electrostatic capacitance is enhanced (by about 20%), and the leak current is reduced. Accordingly, if the heat treatment in an $O_2$ gas stream is carried out, the characteristics required for a thin-film capacitor can be further enhanced.

Furthermore, the cross-sections of the BST complex oxide thin-films were observed, and the film-thickness was measured. The film-thickness of the BST complex oxide thin-film was 100 μm.

Further, the thin-film composition ratio was analyzed by the ICP method. The thin-film composition ratio was Ba:Sr:Ti=33:15:52. That is, the composition was almost the same as that of the raw material solution.

EXAMPLE 2

First, as metal compounds (Ba raw material, Sr raw material and Ti raw material), $Ba(C_5H_7O_2)_2 \cdot 2H_2O$, $Sr(C_5H_7O_2)_2 \cdot 2H_2O$ and $TiO(C_5H_7O_2)_2$ were prepared. As the solvent, methoxyethanol (boiling point: 125° C.) was prepared. It is to be noted that $C_5H_7O_2$ denotes an acetylacetonato ligand and may be referred to as "acac".

The Ba raw material, the Sr raw material and the Ti raw material were compounded so that the molar ratio was 85:30:100.

Then, the solvent was added into the compounded raw materials in such an amount that the total molarity was 0.005 mol/l, and was stirred for 60 minutes by means of a magnetic stirrer to obtain a metal compound solution (raw material solution).

After this, complex oxide thin-films were film-formed by use of the raw material solution under the conditions listed in Table 4.

TABLE 4

| Ba raw material | $Ba(acac)_2 \cdot 2H_2O$ |
|---|---|
| Sr raw material | $Sr(acac)_2 \cdot 2H_2O$ |
| Ti raw material | $TiO(acac)_2$ |
| solvent | methoxyethanol |
| raw material molar ratio of Ba:Sr:Ti | 85:30:100 |
| solution concentration | 0.005 mol/l |
| $O_2$ gas flow rate | 10 LM |
| film-forming temperature | 550° C. |
| film-forming chamber pressure | 22 Torr |
| film-forming time | 3 minute × 6 |

The substrate and the mask employed here were the same as those used in Example 1.

$O_2$ gas was made to flow in the two-fluid nozzle 2 at a rate of 400 CCM and the pressure in the film-forming chamber 3 was reduced by means of the rotary pump 6, and heating of the substrate 4 was started (step (a)). At this time, the pressure in the film-forming chamber 3 was 1 Torr.

The substrate 4, after it reached the film-forming temperature, was maintained as it was for a predetermined time. The $O_2$ gas flow rate was then adjusted to 10 LM and this state was held for 1 minute. Thereafter, introduction of the raw material solution 10 into the two-fluid nozzle 2 was started (step (b)). For introduction of the raw material solution 10, the liquid-feeding pump 1 was operated at 1 pulse/2 seconds. The movement distance of the diaphragm was set so that the liquid feeding rate was 0.8 CCM. At this time, the pressure in the film-forming chamber 3 was set at 22 Torr.

The film-forming was carried out for 3 minute, and then feeding of the raw material solution 10 to the two-fluid nozzle 2 was stopped. One minute after the stopping, the $O_2$ gas rate was adjusted to 400 CCM and the pressure in the film-forming chamber 3 was kept at 1 Torr for 10 minutes (the temperature was 550° C.) again (step (c)).

Thereafter, the $O_2$ gas flow rate was adjusted to 10 LM again, and this state was held for 1 minute. Then, introduction of the raw material solution 10 into the two-fluid nozzle 2 was started, and the film-forming was carried out for 3 minutes. After the film-forming, feeding of the raw material solution 10 to the two-fluid nozzle 2 was stopped. One minute after the stopping, the $O_2$ gas flow rate was adjusted to 400 CCM, and the pressure in the film-forming chamber 3 was adjusted to 1 Torr again, and this state was kept for 10 minutes (at 550° C.) (step (d)).

Then, the above-described step (d) was repeated six times. Thereafter, the pressure in the film-forming chamber 3 was held at 1 Torr for 10 min (at 550° C.) again. Then, the pressure in the film-forming chamber 3 was recovered to the atmospheric pressure and the substrate 4 was cooled.

50 Pt upper electrodes with a diameter of 0.5 mm were formed on the produced complex oxide thin-film by use of the metal mask and heat-treated at 600° C. for 3 hours in an $O_2$ gas stream (at 760 Torr). The electrostatic capacitance, the tan δ, and the leak current, caused when a DC voltage was applied, were measured. The averages of the measurements are listed in Table 5.

TABLE 5

| electrostatic capacitance | tan δ | leak current at 1 V | breakdown voltage |
|---|---|---|---|
| 6600 pF | 2.0% | 11 pA | 9.9 V |

As shown in Table 5, it was ascertained that a high electrostatic capacitance and sufficient characteristics required for the thin-film capacitor with respect to tan δ (loss) and leak current can be obtained. The acetylacetonato complex used is inexpensive, that is, it costs less than one-twentieth that of the CVD raw material used as the raw material in Example 1.

After the characteristics were measured, the cross-sections of the BST complex oxide thin-films were observed. The film-thicknesses were measured. The film-thickness of the BST complex oxide thin-films was 100 nm.

Furthermore, the thin-film composition ratio was analyzed by the ICP method. The thin-film composition ratio was Ba:Sr:Ti=31:16:53.

EXAMPLE 3

First, as the metal compounds (Ba raw material, Sr raw material and Ti raw material), $Ba(i-OC_3H_7)_2$, $Sr(i-OC_3H_7)_2$, and Ti(i-OC$_3$H$_7$)$_2$, were prepared. As the solvent, methoxyethanol containing 0.01 mol % acetylacetone (boiling point: 120° C.) was prepared.

Then, the Ba raw material, the Sr raw material and the Ti raw material were compounded so that the molar ratio was 80:30:100.

To the compounded raw materials, the solvent was added in such an amount that the total molarity was 0.005 mol/l and stirred for 60 minutes by means of a magnetic stirrer to obtain a metal compound solution (raw material solution).

After this, complex oxide thin-films were film-formed by use of the raw material solution under the conditions listed in Table 6. The film-forming method was similar to that of Example 2.

TABLE 6

| | |
|---|---|
| Ba raw material | Ba(i-OC$_3$H$_7$)$_2$ |
| Sr raw material | Sr(i-OC$_3$H$_7$)$_2$ |
| Ti raw material | Ti(i-OC$_3$H$_7$)$_4$ |
| solvent | methoxyethanol + 0.01 mol % acetylacetone |
| raw material molar ratio of Ba:Sr:Ti | 85:30:100 |
| solution concentration | 0.005 mol/l |
| O$_2$ gas flow rate | 10 LM |
| film-forming temperature | 550° C. |
| film-forming chamber pressure | 22 Torr |
| film-forming time | 3 minute × 5 |

Then, on the produced complex oxide thin, 50 Pt upper electrodes with a diameter of 0.5 mm were formed by use of a metal mask, and heat treated in an O$_2$ gas stream at 600° C. for 3 hours. The electrostatic capacitance, the tan δ, and the leak current, caused when a DC voltage was applied under the condition of 1 kHz and 100 mV, by means of an LCR meter. The averages of the measurements are listed in Table 7.

TABLE 7

| electrostatic capacitance | tan δ | leak current at 1 V | breakdown voltage |
|---|---|---|---|
| 6120 pF | 1.5% | 8.5 pA | 11.3 V |

It was ascertained that the obtained complex oxide thin-film can present a high electrostatic capacitance and sufficient characteristics required for the thin-film capacitor with respect to tan δ (loss) and leak current, although the alkoxides used as the Ba and Sr raw materials are about one-tenth, and that of the Ti raw material is one four-hundredth, of the cost of the CVD raw material used as the raw material in Example 1.

Moreover, after the characteristics were measured, the cross-sections of the BST complex oxide thin-films were observed. The film-thicknesses were measured. The film-thicknesses of the BST complex oxide thin-films were 100 nm.

Furthermore, the thin-film composition ratio was analyzed by the ICP method. The thin-film composition ratio was Ba:Sr:Ti=31:17:52.

All of the BST complex oxide thin-films produced by the methods of the above-described Examples 1 to 3 have a high capacitance density of not less than 17 nF/mm$^2$. The breakdown electric field strength is 90 kV/mm. That is, the reliability is high. In addition, the relative dielectric constants of the BST films, calculated based on the obtained electrostatic capacitances, are in the range of 200 to 380.

Thus, it was ascertained that the characteristics comparable to or higher than those of the BST complex oxide thin-films obtained by atomizing the above-described raw material solutions by means of the carburetor can be achieved, although a simple apparatus and inexpensive raw materials are used.

In the above-described Examples 1 to 3, as the metal compounds (raw material), dipivaloylmethanato complexes, the acetylacetonato complexes, and metal alkoxides were used. Metal compounds usable in the present invention are not limited to these metal compounds. For example, at least two kinds of compounds can be employed without problems, e.g., the alkoxides as the Ba and Sr raw materials and the acetylacetonato complex for Ti may be used, provided that no precipitate is formed when the raw materials are dissolved into a single solution. Moreover, a complex alkoxide raw material for Ba and Sr may be employed.

In the above-described Examples 1 to 3, two kinds of the solvents, namely, butoxyethanol and methoxyethanol, were used. Various other solvents can be used provided that the solubilities for the raw materials are adequate. Preferably, solvents having a boiling point at ordinary pressure of at least about 100° C. are used.

High capacitance thin-film capacitors can be obtained by rendering electrodes to the complex oxide thin-films.

Moreover, in other respects, the present invention is not limited to the above examples. A variety of application and modification may be made within the spirit and scope of the present invention.

As described above, the metal compound solution is put into an atomized state by means of the two-fluid nozzle, and the atomized solution is directly introduced into the film-forming chamber of which the pressure is kept at about 100 Torr or lower. Thus, it is not required that the metal compound solution is gasified or atomized to be carried in a piping. As a result, the relation between the gasification temperature and the decomposition temperature is of no moment. The selection flexibility for the raw materials is enhanced. Thus, the complex oxide thin-film having a high dielectric constant and a good reliability can be efficiently produced.

Moreover, as an atomizing device, the two-fluid nozzle is employed. Thus, a sufficient kinetic velocity can be rendered to the formed droplets and a film can be efficiently formed on the heated substrate.

Preferably, the gas used in the two-fluid nozzle contains an oxidative gas. Thus, the film-forming can be carried out in an oxidative atmosphere in the film-forming chamber. As a result, the complex oxide thin-film of which the characteristics are stable can be efficiently produced.

Also, when a solvent having a boiling point of at least about 100° C. under ordinary pressure is used, the solvent component contained in the raw material in the atomized state is evaporated before the raw material nears the substrate. Thus, the raw material can be efficiently formed into a film while powdering of the raw material is inhibited or prevented. Furthermore, even if a solvent with such a high boiling point is used as the solvent, the organic component is suppressed from remaining in the film under film-forming, and a complex oxide thin-film having a good crystallinity and a high dielectric constant can be produced since the pressure in the film-forming chamber is adjusted to about 100 Torr or lower, and moreover, film-forming is carried out while the substrate is in the heated state.

More preferably, at least one of the metal compounds is a dipivaloylmethanato metal compound. In this case, it is possible to use the raw material effectively and stabilize the raw material composition while decomposition of the raw material is efficiently prevented during carrying process. Thus, the characteristic of the thin-film can be stabilized.

Also, preferably, at least the metal compounds is an acetylacetonato complex. In this case, the decomposition of the raw material during carrying process can be efficiently prevented. It becomes possible to use the raw material effectively and stabilize the raw material composition.

Also, preferably, as at least one of the metal compounds is a metal alkoxide. In this case, the decomposition of the raw material during carrying process can be efficiently prevented. It becomes possible to use the raw material effectively and stabilize the raw material composition. Thus, the characteristics of the thin-film can be stabilized.

More preferably, the complex oxide thin-film is formed by carrying out film-forming at least two times, and after each film-forming, the film is heat-treated under a pressure lower than that employed for the film-forming. In this case, organic components can be prevented from remaining in the film, which improves the dielectric constant of the formed dielectric thin-film and enhances the reliability.

Preferably, at least the film obtained after the final film-forming is heat treated at an oxygen gas partial pressure higher than the oxygen gas partial pressure at film-forming. In this case, the complex oxide thin-film having a high crystallinity and a reduced oxygen deficiency can be provided.

The apparatus for producing a complex oxide thin-film of the present invention comprises a solution feeding mechanism for feeding the metal compound solution, a two-fluid nozzle for putting the metal compound solution into an atomized state, a film-forming chamber into which the metal compound solution in the atomized state is introduced and is film-formed into a complex oxide thin-film, a substrate heater for heating the substrate placed in the film-forming chamber to a temperature higher than the boiling point of the solvent, a pressure-reducing pump for the pressure in the film-forming chamber to 100 Torr or lower, and so forth. With the apparatus for producing a complex oxide thin-film, the method of producing a complex oxide thin-film of the present invention can be securely carried out, and the complex oxide thin-film having a high dielectric constant and good reliability can be efficiently produced.

What is claimed is:

1. A method of producing a complex oxide thin-film comprising the steps of:
    (a) providing a metal compound solution comprising at least two metal compounds dissolved in a solvent;
    (b) heating a substrate in a film-forming chamber to a film-forming temperature, and
    (c) after heating the substrate, directly introducing said solution in mist form into the film-forming chamber through a two-fluid nozzle facing a surface of the substrate with an oxidative gas at 5 LM or more, so as be vaporized in said chamber and form a complex oxide thin-film on the substrate.

2. A method of producing a complex oxide thin-film according to claim 1, wherein the solution is atomized in the two-fluid nozzle with an oxidative gas.

3. A method of producing a complex oxide thin-film according to claim 2, wherein the solvent has a boiling point of at least 100° C. under ordinary pressure.

4. A method of producing a complex oxide thin-film according to claim 3, wherein at least one of the metal compounds is a dipivaloylmethanato complex.

5. A method of producing a complex oxide thin-film according to claim 4, wherein at least one of the metal compounds is an acetylacetonato complex.

6. A method of producing a complex oxide thin-film according to claim 5, wherein the solution contains three metal compounds and at least one of the metal compounds is a metal alkoxide.

7. A method of producing a complex oxide thin-film according to claim 6, wherein the film-forming (c) is performed at least two times, and after each film-forming, the film is heat-treated under a pressure lower than that employed for the film forming.

8. A method of producing a complex oxide thin-film according to claim 7, wherein at least the film obtained after the final-forming is heat treated at an oxygen gas partial pressure higher than an oxygen gas partial pressure existent during film-forming.

9. A method of producing a complex oxide thin-film according to claim 1, wherein the solvent has a boiling point of at least about 100° C. under ordinary pressure.

10. A method of producing a complex oxide thin-film according to claim 1, wherein at least one of the metal compounds is a dipivaloylmethanato complex.

11. A method of producing a complex oxide thin-film according to claim 1, wherein at least one of the metal compounds is an acetylacetonato complex.

12. A method of producing a complex oxide thin-film according to claim 1, wherein at least one of the metal compounds is a metal alkoxide.

13. A method of producing a complex oxide thin-film according to claim 1, wherein the film-forming is performed at least two times, and after each film-forming, the film is heat-treated under a pressure lower than that employed for the film-forming.

14. A method of producing a complex oxide thin-film according to claim 1, wherein at least the film obtained by the final film-forming is heat treated at an oxygen gas partial pressure higher than an oxygen gas partial pressure existent during film-forming.

15. A method of producing a complex oxide thin-film according to claim 1, wherein the film-forming chamber having a substrate therein into which the atomized solution is introduced is at a pressure at about 100 Torr or lower.

16. A method of producing a complex oxide thin-film comprising the steps of:
    (a) providing a metal compound solution comprising at least two metal compounds dissolved in a solvent;
    (b) heating a substrate in a film-forming chamber to a film-forming temperature, and
    (c) after heating the substrate, directly introducing said solution in mist form into the film-forming chamber through a two-fluid nozzle facing a surface of the substrate with an oxidative gas at 5 LM or more, so as be vaporized in said chamber and form a complex oxide thin-film on the substrate,
    wherein the metal compound solution is atomized in a two-fluid nozzle having a discharge end in the film-forming chamber containing the substrate, and the atomized solution is directly introducing into the film forming chamber in which the pressure is about 100 Torr or lower by mixing a gas with a metal compound solution in the two-fluid nozzle and discharging the atomized mixture into the chamber.

17. A method of producing a complex oxide thin-film according to claim 16, in which the substrate is heated to a temperature equal to or higher than the boiling point of the solvent.

* * * * *